(12) United States Patent
Yang

(10) Patent No.: US 9,484,384 B2
(45) Date of Patent: Nov. 1, 2016

(54) ARRAY SUBSTRATE OF X-RAY SENSOR AND METHOD FOR MANUFACTURING THE SAME

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Dong Yang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 14/435,870

(22) PCT Filed: Sep. 5, 2014

(86) PCT No.: PCT/CN2014/086069
§ 371 (c)(1),
(2) Date: Apr. 15, 2015

(87) PCT Pub. No.: WO2015/070665
PCT Pub. Date: May 21, 2015

(65) Prior Publication Data
US 2016/0013242 A1 Jan. 14, 2016

(30) Foreign Application Priority Data
Nov. 14, 2013 (CN) .......................... 2013 1 0566270

(51) Int. Cl.
| | | |
|---|---|---|
| H01L 27/14 | (2006.01) | |
| H01L 27/146 | (2006.01) | |
| H01L 27/12 | (2006.01) | |
| H01L 27/144 | (2006.01) | |

(52) U.S. Cl.
CPC ..... *H01L 27/14658* (2013.01); *H01L 27/1214* (2013.01); *H01L 27/1446* (2013.01); *H01L27/1462* (2013.01); *H01L 27/14603* (2013.01); *H01L 27/14607* (2013.01); *H01L 27/14632* (2013.01); *H01L 27/14636* (2013.01); *H01L 27/14687* (2013.01); *H01L 27/14689* (2013.01); *H01L 27/14692* (2013.01)

(58) Field of Classification Search
CPC ............... H01L 27/14658; H01L 27/14689; H01L 27/14687; H01L 27/14692
See application file for complete search history.

(56) References Cited

U.S. PATENT DOCUMENTS

| | | | | |
|---|---|---|---|---|
| 2009/0152563 A1* | 6/2009 | Hayashi | ............ | H01L 27/14692 257/72 |
| 2014/0103347 A1* | 4/2014 | Ishino | ............... | H01L 27/14692 257/59 |

FOREIGN PATENT DOCUMENTS

| | | |
|---|---|---|
| CN | 102790067 A | 11/2012 |
| CN | 103560135 A | 2/2014 |

OTHER PUBLICATIONS

International Search Report dated Nov. 22, 2014; PCT/CN2014/086069.
Written Opinion of the International Searching Authority dated Dec. 1, 2014; PCT/CN2014/086069.

* cited by examiner

*Primary Examiner* — Tran Tran
(74) *Attorney, Agent, or Firm* — Ladas & Parry LLP

(57) ABSTRACT

An array substrate of an X-ray sensor and a method for manufacturing the same are provided, the method comprising a step of forming a thin-film transistor element and a photodiode sensor element, wherein the step of forming the thin-film transistor element comprises: forming a gate electrode (1001) on an base substrate (1000) by a mask process; depositing a gate insulating layer (1005) on the base substrate (1000) on which the gate electrode (1001) is formed; the step of forming the photodiode sensor element comprises: forming an ohmic contact layer (1002) on the base substrate (1000) through the same mask process while forming the gate electrode (1001); forming a semiconductor layer (1003) and a transparent electrode (1004) through a mask process on the substrate (1000) on which the ohmic contact layer (1002) is formed; depositing the gate insulating layer on the base substrate on which the semiconductor layer (1003) and the transparent electrode (1004) are formed while depositing the gate insulating layer (1005) on the base substrate (1000) on which the gate electrode (1001) is formed. A gate pattern and an ohmic contact layer are formed through the same mask process, and a passivation layer substitutes a channel blocking layer to reduce the number of the mask processes and simplify the manufacturing process and improve throughput and yield of the product.

9 Claims, 6 Drawing Sheets

ARRAY SUBSTRATE OF X-RAY SENSOR AND METHOD FOR MANUFACTURING THE SAME

TECHNICAL FIELD

Embodiments of the present invention relate to an array substrate of an X-ray sensor and a method for manufacturing the same.

BACKGROUND

At present, A X-ray sensor is widely used not only in the medical imaging field but also widely in other technical fields such as metal inspection and so on.

As shown in FIGS. 1 and 2, an array substrate of a current X-ray sensor usually includes a photodiode sensor element 200 and a thin-film transistor element 300 in each pixel region, wherein the photodiode sensor element is primarily intended to receive light and convert an optical signal into an electrical signal by photovoltaic effect, and the thin-film transistor element mainly serves as a control switch and is used to transmit the electrical signal generated by the photovoltaic effect.

The working principle of the current X-ray sensor is as follows: when an X-ray 101 bombards a fluorescent powder 102, visible light generated by the fluorescent powder 102 is incident on the photodiode sensor element 200 of the array substrate and an optical signal is converted into an electrical signal by photovoltaic effect, and the electrical signal is transmitted to a control circuit of the X-ray sensor under control of the thin-film transistor element 300.

Exemplarily, in the prior art, the array substrate of the entire X-ray sensor is manufactured by using nine mask processes which comprises the following steps:

Step 301: forming a gate electrode 11 on a substrate 10 through a first mask process;

Step 302: depositing a gate insulating layer 12 and an active material layer on the substrate formed in the step 301 and forming an active layer 13 on the array substrate through a second mask process;

Step 303: forming a channel blocking layer 14 on the substrate formed in step 302 through a third mask process;

Step 304: depositing an ohmic contact layer 29 on the substrate formed in step 303 and forming a source electrode 15, a drain electrode 16 and a reflective layer 17 through a fourth mask process;

Step 305: forming a semiconductor laminating layer, for example, N-type semiconductor 18, I-type semiconductor 19, P-type semiconductor 20, and a transparent electrode 21 (i.e. a portion of a PIN-type photodiode sensor element) on the substrate formed in step 304 through a fifth mask process;

Step 306: depositing a first passivation layer 22 on the substrate formed in step 305 and forming a first through hole 23 and a second through hole 25 in the first passivation layer 22 through a sixth mask process;

Step 307: forming a light-shielding layer 27, a bias electrode 24 and a signal line 26 on the substrate formed in step 306 through a seventh mask process;

Step 308: depositing a second passivation layer 28 on the substrate formed in step 307 and forming a passivation layer through hole (not shown) in a signal guide region through an eighth mask process; and Step 309: forming a transparent electrode (not shown) in the signal guide region on the substrate formed in step 308 through a ninth mask process.

During manufacturing an array substrate of an X-ray sensor in the prior art, it is necessary to form a channel blocking layer above the active layer through one mask process, and the array substrate of the X-ray sensor is produced through nine mask processes, which is a complex manufacturing process. Furthermore, the more the number of the mask processes is, the higher the manufacture cost is, and the lower the yield of the product is.

SUMMARY

Embodiments of the present invention provide an array substrate of an X-ray sensor and a method for manufacturing the same, which reduces the number of mask processes, simplifies manufacture process and increases product yield.

An embodiment of the present invention provides a method for manufacturing an array substrate of an X-ray sensor, the method comprising a step of forming a thin-film transistor element and a step of forming a photodiode sensor element, wherein the step of forming the thin-film transistor element comprises: forming a gate electrode on an base substrate by a mask process; depositing a gate insulating layer on the base substrate on which the gate electrode is formed; the step of forming the photodiode sensor element comprises: forming an ohmic contact layer on the base substrate through a same mask process with the gate electrode while forming the gate electrode; forming a semiconductor layer and a transparent electrode through a mask process on the substrate on which the ohmic contact layer is formed; and depositing the gate insulating layer on the base substrate on which the semiconductor layer and the transparent electrode are formed while depositing the gate insulating layer on the base substrate on which the gate electrode is formed.

An embodiment of the present invention further provides an array substrate of an X-ray sensor, comprising a thin-film transistor element and a photodiode sensor element connected to the thin-film transistor element, wherein the thin-film transistor element comprises: a gate electrode on an base substrate; a gate insulating layer above the gate electrode; the photodiode sensor element comprises: an ohmic contact layer on the base substrate; a semiconductor layer and a transparent electrode on the ohmic contact layer; and a gate insulating layer on the semiconductor layer and the transparent electrode.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In steps of forming a thin-film transistor element and a photodiode sensor element in an embodiment of the present invention, a gate pattern and an ohmic contact layer are formed through the same mask process, and a semiconductor layer and a transparent electrode pattern are formed on the ohmic contact layer through one mask process, and a gate insulating layer is deposited on the substrate on which the semiconductor layer, the transparent electrode pattern and the gate pattern are formed, and an active layer pattern is formed on the substrate on which the gate insulating layer is formed through a masking process; a passivation layer is deposited on the substrate on which the active layer pattern is formed and a through hole is formed in the passivation layer, the passivation layer may be served as a channel blocking layer. Thus, a step of forming the channel blocking layer by using one mask process is omitted. Furthermore, in embodiments of the present invention, the gate pattern and the ohmic contact layer are formed only through one mask process, thereby simplifying a manufacturing process of an entire substrate and increasing capacity. Since the process is simplified, product yield is enhanced as well.

The illustration will be made further with reference to the drawings.

Figure 1:
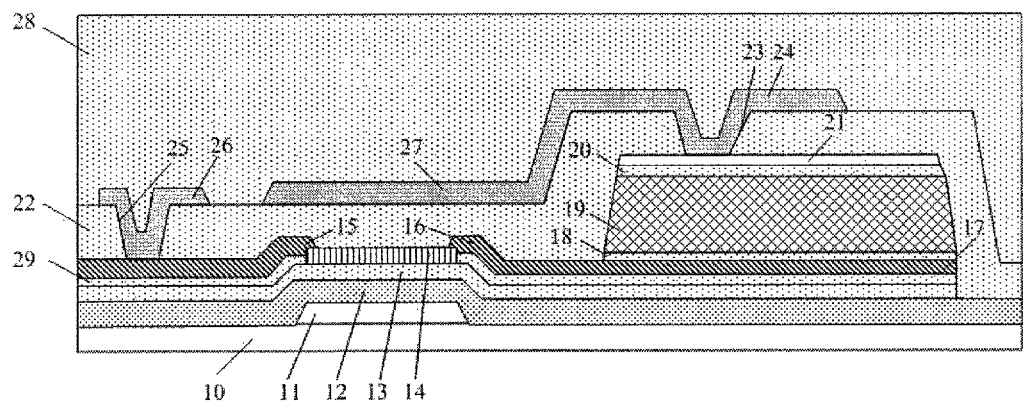
FIG. 1 is a cross-sectional structural view of an array substrate of an X-ray sensor in the prior art.
Figure 2:
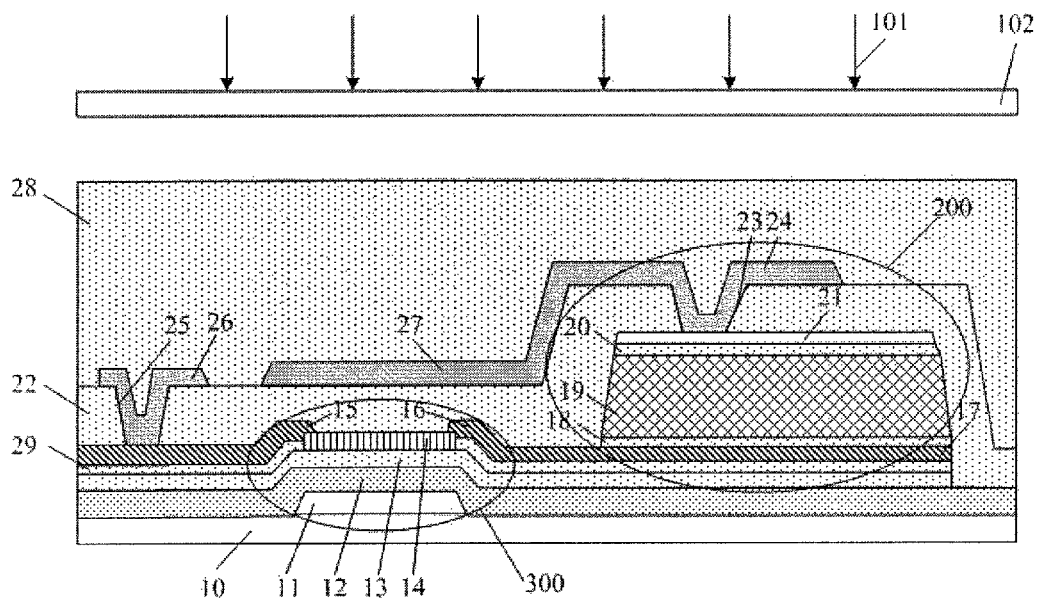
FIG. 2 shows a working principle of an X-ray sensor in the prior art.
Figure 3:
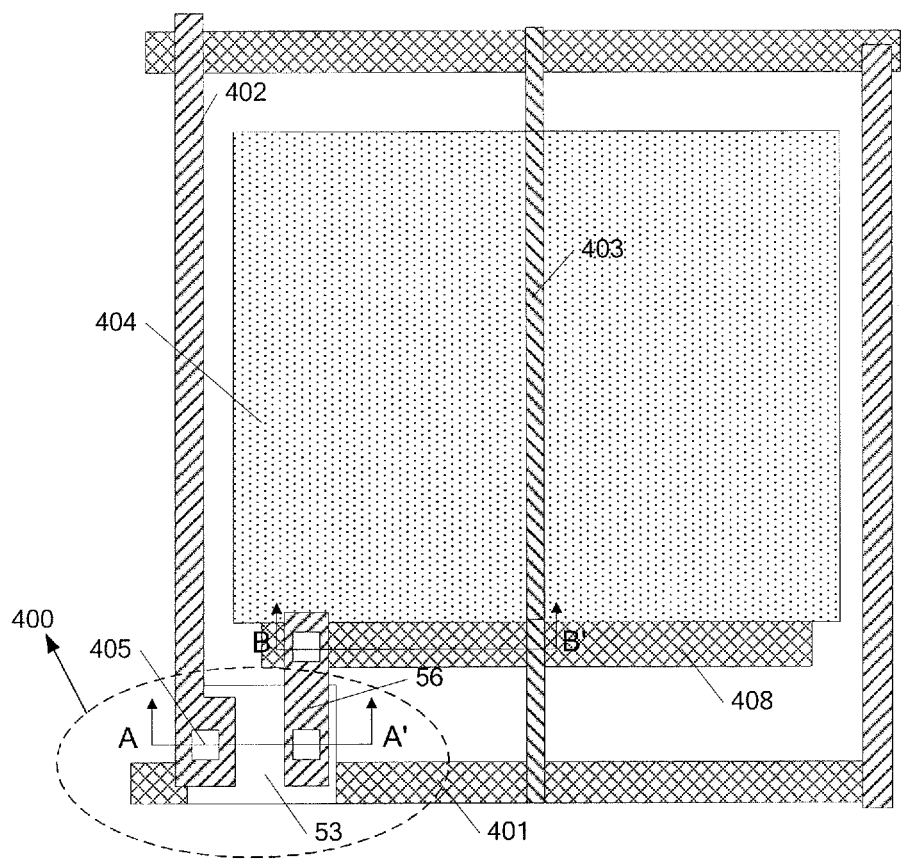
FIG. 3 is a structural planar view of an array substrate of an X-ray sensor according to an embodiment of the present invention.
Figure 4:
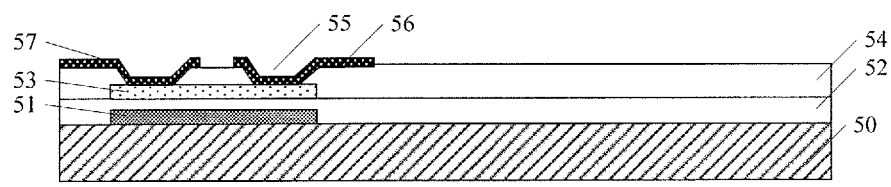
FIG. 4 is a cross-sectional view of an array substrate of an X-ray sensor taken along a AA' line in FIG. 3 according to an embodiments of the present invention.

FIG. 3 shows a structural planar view of an array substrate of an X-ray sensor according to an embodiment of the present invention, wherein 401 denotes a gate line; 402 denotes a data line; 403 represents a bias line; 404 represents a photodiode sensor element; 405 represents a through hole; 56 represents a source electrode of a thin-film transistor element; 53 represents an active layer of the thin-film transistor element; 408 represents an ohmic contact layer of the photodiode sensor element. FIG. 4 shows a structural cross-sectional view of an AA' portion in FIG. 3, i.e. a cross-sectional view of a region in which the thin-film transistor element is disposed. The thin-film transistor element 400 includes a gate electrode 51 on a base substrate 50 and a gate insulating layer 52 on the gate electrode 51.

The thin-film transistor element further includes the active layer 53 on the gate insulating layer 52; a first passivation layer 54 on the active layer 53, the first passivation layer 54 being provided with a first through hole 55; a drain electrode 57 and the source electrode 56 disposed on the first passivation layer 54 and connected to the active layer 53 via the first through hole 55.

In the structural cross-sectional view of the thin-film transistor element shown in FIG. 4, the gate insulating layer 52 covers the gate electrode 51 as well as the base substrate 50 uncovered by the gate electrode; the active layer 53 is formed on the gate insulating layer 52 and overlaps with the gate electrode 51; the first passivation layer 54 covers the active layer 53 as well as the gate insulating layer 52 uncovered by the active layer 53, and the first passivation layer 54 is provided with the first through hole 55 through which the source electrode 56 and the drain electrode 57 formed on the first passivation layer 54 are connected to the active layer 53.

Exemplarily, the base substrate 50 may be a glass substrate, a plastic substrate or other types of substrate. The active layer 53 may be mainly formed of a-Si. The first passivation layer 54 may be formed of an inorganic insulating film e.g. silicon nitride, or an organic insulating film, e.g. resin material and so on.

Figure 5:
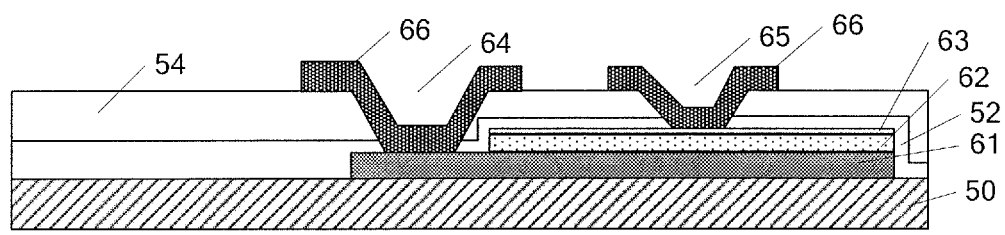
FIG. 5 is a cross-sectional view of an array substrate of an X-ray sensor taken along a BB' line in FIG. 3 according to an embodiment of the present invention.

FIG. 5 shows a structural cross-sectional view of a BB' portion in FIG. 3, i.e.

cross-sectional view of a region in which the photodiode sensor element is disposed. The photodiode sensor element 400, exemplarily, includes: an ohmic contact layer 61 on the base substrate 50; a semiconductor layer 62 and a transparent electrode 63 on the ohmic contact layer 61; a gate insulating layer 52 on the semiconductor layer 62 and the transparent electrode 63, and a first passivation layer 54.

Exemplarily, in the photodiode sensor element 404, a second through hole 64 and a third through hole 65 are formed in the gate insulating layer 52 and the first passivation layer 54. Further, the photodiode sensor element 404 further includes a bias line 66 on the first passivation layer 54, the bias line 66 being connected to the ohmic contact layer 61 via the second through hole 64 and to the transparent electrode 63 via the third through hole 65.

Here, the transparent electrode 63 is disposed on the semiconductor layer 62. The gate insulating layer 52 covers the transparent electrode 63, the ohmic contact layer 61 not covered by the transparent electrode and the base substrate 50 not covered by the ohmic contact layer 61. The first passivation layer 54 is formed on the gate insulating layer 52. The gate insulating layer 52 and the first passivation layer 54 are provided with the second through hole 64 and the third through hole 65 through which the bias line 66 formed therein is connected to the ohmic contact layer 61 and the transparent electrode 63 respectively.

Exemplarily, the semiconductor layer 62 may includes three layers in sequence: an N-type amorphous silicon layer formed on the ohmic contact layer 61, an intrinsic amorphous silicon layer formed on the N-type amorphous silicon layer, and a P-type amorphous silicon layer formed on the intrinsic amorphous silicon layer, i.e., the photodiode sensor element 404 is a PIN-type photodiode. Exemplarily, the photodiode sensor element 404 may be a MIS-type photodiode.

In the array substrate of the X-ray sensor according to an embodiment of the present invention, the gate pattern of the thin-film transistor element and the ohomic contact layer of the photodiode sensor element are formed by one mask process, which avoid forming the gate pattern and the ohomic contact layer by using more than one mask processes, thus reducing the number of the mask processes and decreasing the cost.

Further, the first passivation layer is deposited directly on the substrate on which the active layer pattern is formed and is provided with the first through hole therein such that the drain electrode and the source electrode are connected to the active layer via the first through hole, and a step of forming a channel blocking layer by a mask process is omitted. Since the channel blocking layer is not formed through the mask process but is replaced with the passivation layer to prevent affecting the channel during subsequent process, the manufacturing process is further simplified and the manufacturing cost is further decreased.

Moreover, in the array substrate of the X-ray sensor according to an embodiment of the present invention, the gate insulating layer covers the gate electrode and the ohmnic contact layer, thereby the gate electrode and the ohmnic contact layer are not required to be respectively covered by insulating layers, thus reducing structure complexity of the array substrate.

On the other hand, an embodiment of the present invention further provides a method for manufacturing an array substrate of an X-ray sensor, comprising a step of forming a thin-film transistor element and a photodiode sensor element, comprising:

a step of forming the thin-film transistor element, comprising:

Step 701: forming a gate pattern on a substrate by a mask process; and

Step 702: depositing a gate insulating layer on the substrate on which the gate pattern is formed;

the step of forming the photodiode sensor element, comprising:

Step 801: forming an ohmic contact layer pattern through the same mask process while forming the gate pattern;

Step 802: forming a semiconductor layer and a transparent electrode pattern through a mask process on the substrate on which the ohmic contact layer pattern is formed; and Step 803: the gate insulating layer deposited covers the semiconductor layer and the transparent electrode pattern.

It is thus known from the above embodiments that the gate pattern of the thin-film transistor element and the ohmic contact layer of the photodiode sensor element are formed through one mask process, which avoid forming the gate pattern and the ohomic contact layer by using more than one mask processes, thus reducing the number of the mask processes and decreasing the cost.

Exemplarily, the step of forming the thin-film transistor element further comprises: forming an active layer through a mask process on the substrate on which the gate insulating layer is formed; depositing a first passivation layer on the substrate on which the active layer is formed and forming a first through hole in the first passivation layer through a mask process; forming a drain electrode and a source electrode through a mask process on the substrate on which the first through hole is formed, and the drain electrode and the source electrode are connected with the active layer via the first through hole.

Accordingly, the step of forming the photodiode sensor element further comprises: forming a second through hole and a third through hole through the same mask process in the gate insulating layer and the first passivation layer formed on the semiconductor layer and the transparent electrode pattern while forming the first through hole in the first passivation layer; forming a bias line through the same mask process in the substrate on which the second through hole and the third through hole are formed while forming the drain electrode and the source electrode, the bias line being connected to the ohmic contact layer through the second through hole and to the transparent electrode through the third through hole.

In the above embodiments, the first passivation layer is deposited directly on the substrate on which the active layer is formed and has the first through hole therein through which the drain electrode and the source electrode are connected to the active layer. Thus, the step of forming a channel blocking layer by one mask process is omitted. The channel blocking layer is not formed through a mask process but is replaced with the passivation layer to prevent affecting the channel during subsequent process.

Exemplarily, after the drain electrode and the source electrode of the thin-film transistor element and the bias line of the photodiode sensor element are formed, a second passivation layer is deposited on the entire substrate and formed with a through hole therein through a mask process.

Figure 6:
FIG. 6 is a schematic view of a substrate after formation of a gate electrode in a method for manufacturing an array substrate of an X-ray sensor according to an embodiment of the invention.
Figure 7:
FIG. 7 is a schematic view of a substrate after formation of an ohmic contact layer in the method for manufacturing an array substrate of an X-ray sensor according to an embodiment of the invention.
Figure 8:
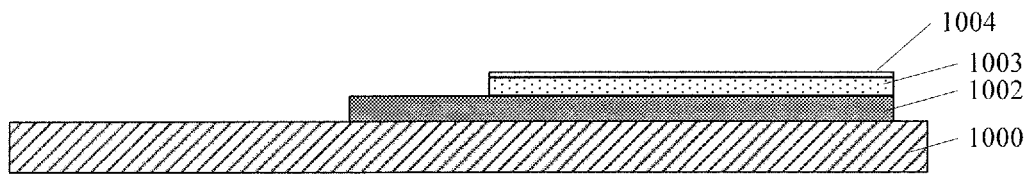
FIG. 8 is a schematic view of a substrate after formation of a semiconductor layer and a transparent electrode in the method for manufacturing an array substrate of an X-ray sensor according to an embodiment of the invention.
Figure 9:
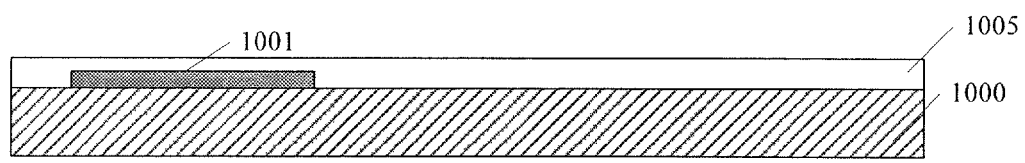
FIG. 9 is a schematic view of a substrate after deposition of a gate insulating layer on the gate electrode in the method for manufacturing an array substrate of an X-ray sensor according to an embodiment of the invention.
Figure 10:
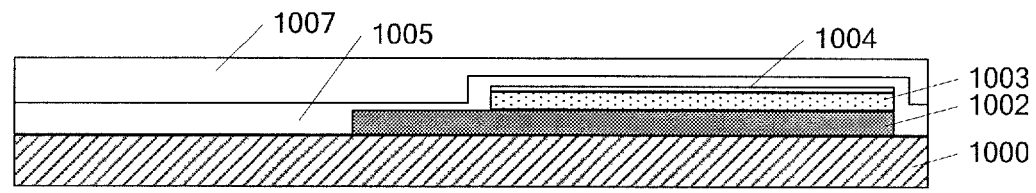
FIG. 10 is a schematic view of a substrate after deposition of a gate insulating layer and a first passivation layer on the semiconductor layer and the transparent electrode in the method for manufacturing an array substrate of an X-ray sensor according to an embodiment of the invention.
Figure 11:
FIG. 11 is a schematic view of a substrate after formation of an active layer in the method for manufacturing an array substrate of an X-ray sensor according to an embodiment of the invention.
Figure 12:
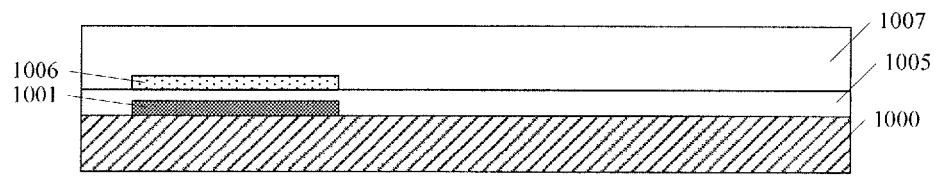
FIG. 12 is a schematic view of a substrate after deposition of a first passivation layer in the method for manufacturing an array substrate of an X-ray sensor according to an embodiment of the invention.
Figure 13:
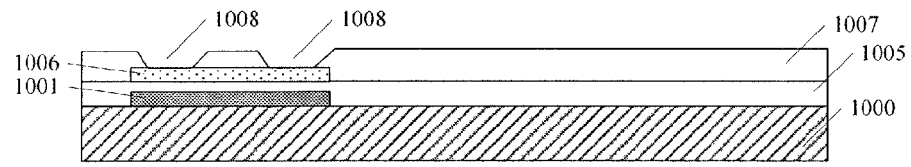
FIG. 13 is a schematic view of a substrate after formation of a first through hole in the method for manufacturing an array substrate of an X-ray sensor according to an embodiment of the invention.
Figure 14:
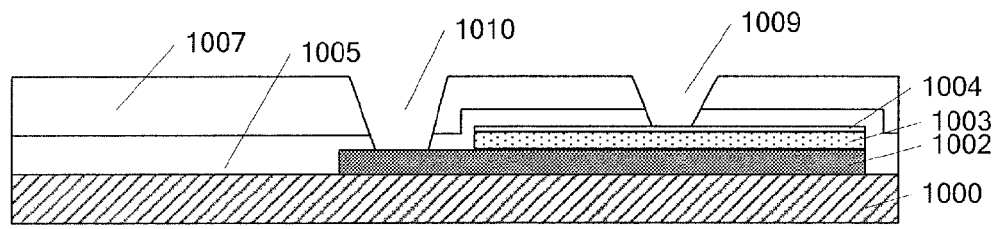
FIG. 14 is a schematic view of a substrate after formation of a second through hole and a third through hole in the method for manufacturing an array substrate of an X-ray sensor according to an embodiment of the invention.
Figure 15:
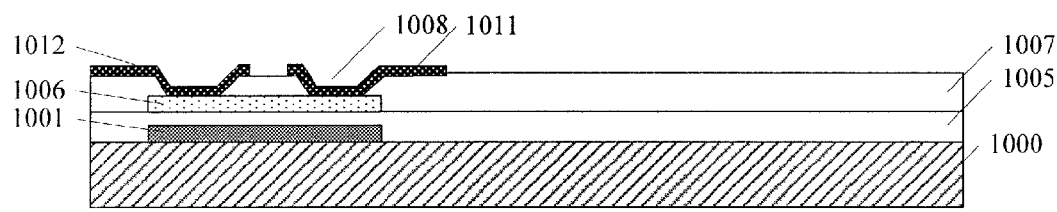
FIG. 15 is a schematic view of a substrate after formation of a source electrode and a drain electrode in the method for manufacturing an array substrate of an X-ray sensor according to an embodiment of the invention.
Figure 16:
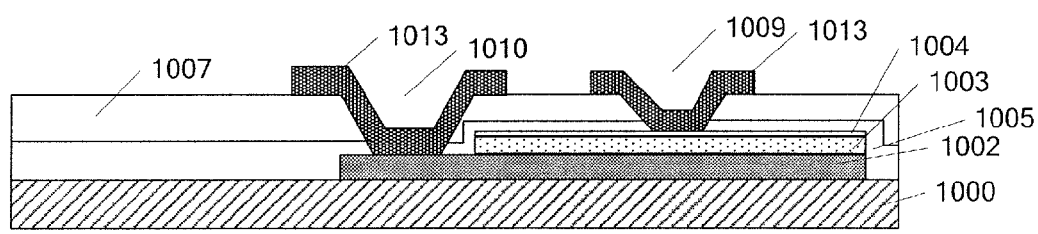
FIG. 16 is a schematic view of a substrate after formation of a bias line in the method for manufacturing an array substrate of an X-ray sensor according to an embodiment of the invention.

Exemplarily, the following is a depiction of the method for manufacturing the array substrate of the X-ray sensor according to an embodiment of the invention, the method comprising:

Step 901: forming a gate electrode 1001 and an ohmic contact layer 1002 on an base substrate 1000 though a first mask process, wherein FIG. 6 shows the substrate on which the gate electrode 1001 is formed and FIG. 7 shows the substrate on which the ohmic contact layer 1002 is formed;

Step 902: forming a semiconductor layer 1003 and a transparent electrode 1004 on the ohmic contact layer 1002 of the base substrate 1000 through a second mask process, wherein FIG. 8 shows the substrate on which the semiconductor layer 1003 and the transparent electrode 1004 are formed;

Step 903: depositing a gate insulating layer 1005 on the substrate on which the gate electrode 1001, the semiconductor layer 1003 and the transparent electrode 1004 are formed, wherein FIG. 9 shows the substrate formed after deposition of the gate insulting layer 1005 on the gate electrode 1001, and FIG. 10 shows the substrate formed after deposition of the gate insulating layer 1005 on the semiconductor layer 1003 and the transparent electrode 1004;

Step 904: forming an active layer 1006 through a third mask process on the substrate on which the gate insulating layer is formed, the active layer 1006 overlapping with the gate electrode 1001, wherein FIG. 11 shows the substrate on which the active layer 1006 is formed;

Step 905: depositing a first passivation layer 1007 on the substrate on which the active layer 1006 is formed, wherein FIG. 12 shows the substrate formed after deposition of the first passivation layer;

Step 906: patterning the first passivation layer 1007 on the active layer 1006, the gate insulating layer 1005 and the first passivation layer 1007 on the transparent electrode 1004 through a fourth mask process, wherein the first through hole 1008 is formed in the first passivation layer 1007 at a position corresponding to the active layer, and the second through hole 1009 is formed in the gate insulating layer 1005 and the first passivation layer 1007 at a position corresponding to the transparent electrode 1004, and the third through hole 1010 is formed in the gate insulating layer 1005 and the first passivation layer 1007 at a position corresponding to the ohmic contact layer 1002. FIG. 13 shows the substrate after the first through hole is formed and FIG. 14 shows the substrate after the second and third through holes are formed;

Step 907: forming a source electrode 1011 and a drain electrode 1012 on the substrate on which the first through hole 1008 is formed and forming a bias line 1013 on the substrate on which the second through hole 1009 and the third through hole 1010 are formed through a fifth mask process, wherein the source electrode 1011 and the drain electrode 1012 are connected to the active layer 1006 via the first through hole 1008, and the bias line 1013 is connected to the transparent electrode 1004 via the second through hole 1009 and to the ohmic contact layer 1002 via the third through hole 1010. FIG. 15 shows a substrate on which the source electrode 1011 and the drain electrode 1012 are formed, and FIG. 16 shows a substrate on which the bias line is formed; and Step 908: depositing a second passivation layer 1014 on the substrate on which the bias line, the source electrode and the drain electrode are formed, and forming a through hole in the second passivation layer 1014 through a sixth mask process.

Figure 17:
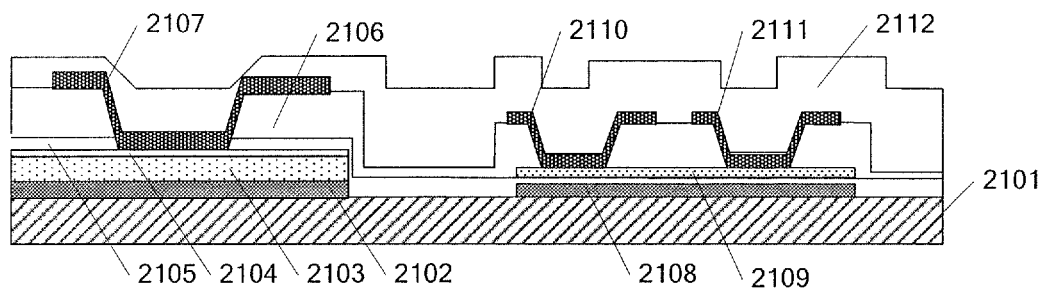
FIG. 17 shows a cross-sectional view of an array substrate of an X-ray sensor according to an embodiment of the invention.

FIG. 17 illustrates a cross-sectional structural view of an array substrate in an embodiment of the invention, wherein 2101 represents an base substrate; 2102 represents an ohmic contact layer; 2103 a semiconductor layer; 2104 represents a transparent electrode; 2105 represents a gate insulating layer; 2106 represents a first passivation layer; 2107 represents a bias line; 2108 represents a gate electrode; 2109 represents an active layer; 2110 represents a drain electrode; 2111 represents a source electrode and 2112 represents a second passivation layer.

Exemplarily, each mask process in an embodiment of the present invention may include cleaning of the substrate, coating of photoresist, exposing, developing, etching, photoresist stripping and so on. The base substrate in an embodiment of the present invention may be a glass substrate, a plastic substrate or other types of substrate. The main component of material of the active layer is a-Si. The first passivation layer may be formed by an inorganic insulating film e.g. silicon nitride, or an organic insulating film, e.g. resin material and so on.

In embodiments of the present invention, exemplarily, deposition may be performed by using, for example, a chemical vapor deposition method during forming the gate electrode and the ohmic contact layer, and deposition of a metal layer may be performed by using a physical vapor deposition method, and deposition of a non-metal layer may be performed by the chemical vapor deposition method. For the passivation layer and the gate insulating layer, a desired pattern may be formed by a dry etching method.

It can be seen from the method of manufacturing the array substrate of the X-ray sensor according to embodiments of the invention that the gate electrode and the ohmic contact layer are formed by one mask process, which effectively reduces the number of mask processes; and the active layer, the transparent electrode and the semiconductor layer are covered with the passivation layer directly; the passivation layer can shield light effectively to remarkably reduce leakage current in the channel, thereby avoiding to form a channel blocking layer by using one mask process again. Moreover, a further passivation layer is disposed on the source electrode, the drain electrode and the bias line to further shield light and further reduce leakage current in the channel.

An embodiment of the present invention provides a method for manufacturing an array substrate of an X-ray sensor, wherein in a step of forming a thin-film transistor element and a photodiode sensor element, the gate electrode and the ohmic contact layer are formed by the same mask process, and the semiconductor layer and the transparent electrode are formed on the ohmic contact layer through one mask process, the gate insulating layer is deposited on which the semiconductor layer, the transparent electrode and the gate electrode are formed and the active layer is further formed. Further, the passivation layer is deposited on the active layer, which omit a step of forming a channel blocking layer through a mask process in prior art, because the passivation layer has a function of the channel blocking layer and can prevent affecting the channel during subsequent process. Also, in the prior art, formation of the gate electrode and the ohmic contact layer respectively require one mask process. In embodiments of the invention, positions of the gate electrode and the ohmic contact layer are changed, which omits one mask process and simplifies the manufacturing process of the array substrate and the throughput is increased. The product yield is also increased because of simplification of the process.

An embodiment of the present invention further provides an X-ray sensor, comprising the array substrate of the X-ray sensor according to an embodiment of the present invention.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

This application claims priority from Chinese patent application No. 201310566270.4 filed on Nov. 14, 2013, the disclosure of which is hereby incorporated herein in its entirety as a part of the present application.

The invention claimed is:

1. An array substrate of an X-ray sensor, comprising a thin-film transistor element and a photodiode sensor element connected to the thin-film transistor element, wherein the thin-film transistor element comprises:
    a gate electrode on an base substrate;
    a gate insulating layer above the gate electrode;
    the photodiode sensor element comprises:
    an ohmic contact layer on the base substrate;
    a semiconductor layer and a transparent electrode on the ohmic contact layer; and
    the gate insulating layer on the semiconductor layer and the transparent electrode,
    wherein the ohmic contact layer and the gate electrode are formed in a same layer by a same mask process.

2. The array substrate according to claim 1, wherein the thin-film transistor element further comprises:
    an active layer on the gate insulating layer;
    a first passivation layer on the active layer, the first passivation layer being provided with a first through hole therein; and
    a drain electrode and a source electrode on the passivation layer, which are connected to the active layer via the first through hole.

3. The array substrate according to claim 2, wherein the photodiode sensor element further comprises:
    the first passivation layer on the gate insulating layer, the first passivation layer and the gate insulating layer being provided with a second through hole and a third through hole therein.

4. The array substrate according to claim 3, wherein the photodiode sensor element further comprises:
    a bias line on the first passivation layer, the bias line being connected to the transparent electrode via the second through hole and to the ohmic contact layer via the third through hole.

5. The array substrate according to claim 4, further comprising:
    a second passivation layer, formed on the source electrode, the drain electrode and the bias line, wherein the second passivation layer is provided with a through hole therein.

6. The array substrate according to claim 1, wherein the base substrate is a glass substrate or a plastic substrate.

7. The array substrate according to claim 1, wherein the active layer comprises a-Si.

8. The array substrate according to claim 1, wherein the first passivation layer comprises an inorganic insulating film or an organic insulating film.

9. The array substrate according to claim 1, wherein the semiconductor layer of the photodiode sensor element comprises a N-type amorphous silicon layer formed on the ohmic contact layer, an intrinsic amorphous silicon layer formed on the N-type amorphous silicon layer and a P-type amorphous silicon layer formed on the intrinsic amorphous silicon layer.

* * * * *